United States Patent [19]
Seefeldt et al.

[11] Patent Number: 5,736,430
[45] Date of Patent: Apr. 7, 1998

[54] TRANSDUCER HAVING A SILICON DIAPHRAGM AND METHOD FOR FORMING SAME

[75] Inventors: James D. Seefeldt, DeForest; Michael F. Mattes, Janesville, both of Wis.

[73] Assignee: SSI Technologies, Inc., Janesville, Wis.

[21] Appl. No.: 480,267

[22] Filed: Jun. 7, 1995

[51] Int. Cl.$^6$ .................................................. H01L 21/465
[52] U.S. Cl. ..................... 438/53; 438/705; 438/960
[58] Field of Search ............... 437/228 IT, 228 SEN, 437/64, 71, 901, 921, 927, 20; 156/628.1, 657.1, 644.1; 216/87; 148/DIG. 128; 73/721, 517 R; 438/53, 705, 960; 257/108, 254, 419

[56] References Cited

U.S. PATENT DOCUMENTS

| | | | |
|---|---|---|---|
| 3,909,924 | 10/1975 | Vindasius et al. | 29/574 |
| 4,258,565 | 3/1981 | Sawayama et al. | 73/141 R |
| 4,567,451 | 1/1986 | Greenwood . | |
| 4,628,740 | 12/1986 | Ueda et al. | 73/705 |
| 4,665,610 | 5/1987 | Barth | 437/228 |
| 4,744,863 | 5/1988 | Guckel et al. | 156/653 |
| 4,766,666 | 8/1988 | Sugiyama et al. | 29/610 |
| 4,771,638 | 9/1988 | Sugiyama et al. | 73/721 |
| 4,771,639 | 9/1988 | Saigusa et al. | 73/727 |
| 4,772,786 | 9/1988 | Langdon | 250/231 R |
| 4,784,721 | 11/1988 | Holmen et al. | 156/647 |
| 4,800,759 | 1/1989 | Hirata et al. | 73/708 |
| 4,805,456 | 2/1989 | Howe et al. | 73/517 AV |
| 4,841,272 | 6/1989 | Yamagishi et al. | 338/2 |
| 4,841,775 | 6/1989 | Ikeda et al. | 73/704 |
| 4,853,669 | 8/1989 | Guckel et al. | 338/4 |
| 4,889,590 | 12/1989 | Tucker et al. | 156/647 |
| 4,893,509 | 1/1990 | MacIver et al. | 156/647 |
| 4,897,360 | 1/1990 | Guckel et al. | 437/7 |
| 4,901,570 | 2/1990 | Chang et al. | 73/517 AV |
| 4,926,143 | 5/1990 | Harada et al. | 331/156 |
| 4,945,769 | 8/1990 | Sidner et al. | 73/727 |

(List continued on next page.)

FOREIGN PATENT DOCUMENTS

| | | | |
|---|---|---|---|
| 1-136378 | 5/1989 | Japan | 437/901 |
| A05082806 | 4/1993 | Japan . | |

OTHER PUBLICATIONS

H. Guckel et al., "Planar Processed, Integrated Displacement Sensors", Micromachining and Micropackaging of Transducers, Elsevier Science Publishers B.V., Amsterdam, 1985, pp. 199–203.

H. Guckel et al., "A Technology for Integrated Transducers", Wisconsin Center for Applied Microelectronics, 1985, pp. 90–92.

Ikeda et al., "Silicon Pressure Sensor with Resonant Strain Gages Built into Diaphragm", Technical Digest of the 7th Sensor Symposium, 1988, pp. 55–58.

Ikeda et al., "Three Dimensional Micromachining of Silicon Resonant Strain Gage", Technical Digest of the 7th Sensor Symposium, 1988, pp. 193–196.

(List continued on next page.)

*Primary Examiner*—Jey Tsai
*Assistant Examiner*—S. Mulpuri
*Attorney, Agent, or Firm*—Michael, Best & Friedrich LLP

[57] ABSTRACT

A method of forming apparatus including a force transducer on a silicon substrate having an upper surface, the silicon substrate including a dopant of one of the n-type or the p-type, the force transducer including a cavity having spaced side walls and a diaphragm supported in the cavity, the diaphragm extending between the side walls of the cavity, comprising the steps of: a. implant in the substrate a layer of a dopant of the one of the n-type or the p-type; b. deposit an epitaxial layer on the upper surface of the substrate, the epitaxial layer including a dopant of the other of the n-type or the p-type; c. implant spaced sinkers through the epitaxial layer and into electrical connection with the layer of a dopant of the one of the n-type or the p-type, each of the sinkers including a dopant of the one of the n-type or the p-type; d. anodize the substrate to form porous silicon of the sinkers and the layer; e. oxidize the porous silicon to form silicon dioxide; and f. etch the silicon dioxide to form the cavity and diaphragm.

6 Claims, 5 Drawing Sheets

U.S. PATENT DOCUMENTS

| | | | |
|---|---|---|---|
| 4,956,795 | 9/1990 | Yamaguchi et al. | 364/571.03 |
| 4,966,649 | 10/1990 | Harada et al. | 156/647 |
| 4,975,390 | 12/1990 | Fujii et al. | 437/228 |
| 4,993,143 | 2/1991 | Sidner et al. | 29/621 |
| 5,009,108 | 4/1991 | Harada et al. | 73/704 |
| 5,090,254 | 2/1992 | Guckel et al. | 73/862.59 |
| 5,095,401 | 3/1992 | Zavracky et al. | 357/51 |
| 5,110,373 | 5/1992 | Mauger | 148/33.2 |
| 5,188,983 | 2/1993 | Guckel et al. | 438/53 |
| 5,242,863 | 9/1993 | Xiang-Zheng et al. | 437/228 |
| 5,313,836 | 5/1994 | Fujii et al. | 73/517 R |
| 5,332,469 | 7/1994 | Mastrangelo | 156/643 |
| 5,352,635 | 10/1994 | Tu et al. | 437/901 |
| 5,380,373 | 1/1995 | Kimura et al. | 437/927 |
| 5,405,786 | 4/1995 | Kurtz | 437/901 |
| 5,542,558 | 8/1996 | Benz et al. | 438/960 |
| 5,550,078 | 8/1996 | Lee et al. | 156/628.1 |
| 5,656,512 | 8/1997 | Beitman | 438/52 |

OTHER PUBLICATIONS

Lee, "The Fabrication of Thin, Freestanding, Single–Crystal, Semiconductor Membranes", J. Electrochem. Soc., vol. 137, No. 8, 1990, pp. 2556–2574.

H. Guckel, "Surface micromachined pressure transducers", Sensors and Actuators A, 20, 1991, pp. 133–146.

Yoshida et al., "Photo–Induced Preferential Anodization for Fabrication of Monocrystalline Micromechanical Structures", Micro Electro Mechanical Systems, 1992, pp. 56–61.

Anderson et al., "Porous Polycrystalline Silicon: A New Material for MEMS", Journal of Microelectromechanical Systems, vol. 3, No. 1, 1994, pp. 10–18.

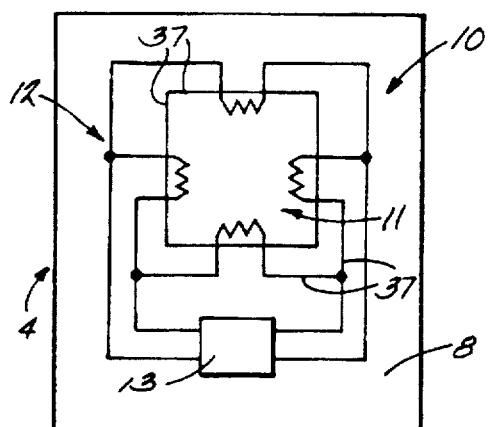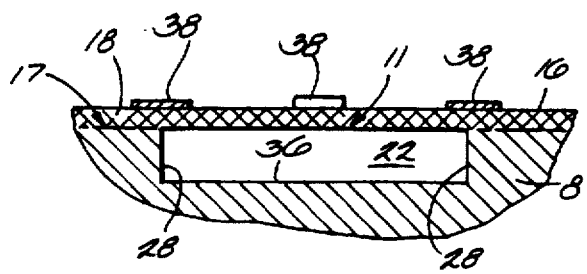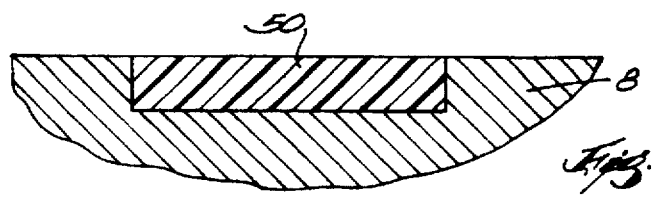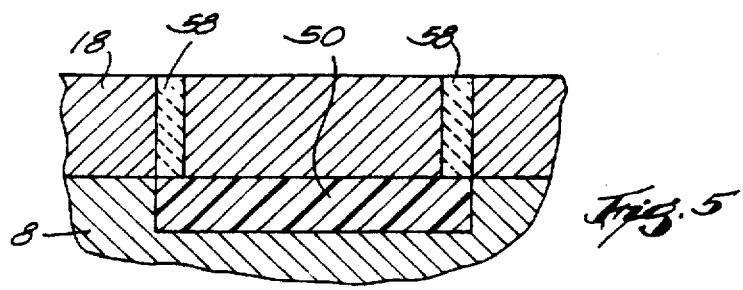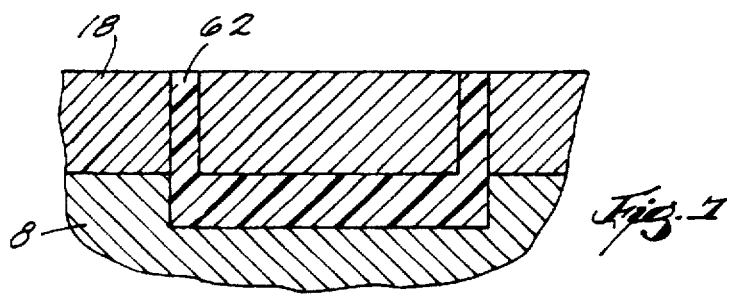

TRANSDUCER HAVING A SILICON DIAPHRAGM AND METHOD FOR FORMING SAME

BACKGROUND OF THE INVENTION

1. Field of the Invention

The invention relates to transducers such as pressure sensors which include a silicon plate formed in a silicon wafer, and particularly to a method for forming the same.

2. Discussion of Prior Art

U.S. Pat. No. 5,242,863 to Xiang-Zheng et al. relates to a silicon diaphragm piezoresistive pressure sensor having a diaphragm formed by a single-sided fabrication method. The diaphragm is formed with a cavity thereunder by: a) forming a buried low resistance layer under a predetermined diaphragm region; b) epitaxial deposition of silicon; c) forming low resistance trenches through the epitaxial layer and connecting with the buried low resistance layer at the edge of the buried low resistance layer; d) converting the low resistance trenches and buried low resistance layer to porous silicon by anodization in a concentrated HF solution; e) removing the porous silicon by etching; and f) filling the openings formed by etching with polysilicon to seal the cavity.

SUMMARY OF THE INVENTION

The invention provides transducers including a pressure sensor having a diaphragm and which is of relatively simple and inexpensive construction.

The invention provides a method having relatively few manufacturing steps for forming such apparatus including a pressure sensor having a diaphragm formed in a silicon wafer. Particularly, the invention provides a method of forming a pressure sensor on a silicon substrate. The pressure sensor has an upper surface, a cavity below the upper surface and having spaced side walls, and a diaphragm supported in the cavity. The diaphragm extends between the side walls of the cavity.

The method includes the steps of: (a) implanting in the substrate a layer of a dopant of said one of the n-type or the p-type; (b) depositing an epitaxial layer on the upper surface of the substrate so that the epitaxial layer includes a dopant of the other of the n-type or the p-type; (c) implanting spaced sinkers through the epitaxial layer and into electrical connection with the layer of a dopant of the one of the n-type or the p-type such that each of the sinkers includes a dopant of the one of the n-type or the p-type; (d) anodizing the substrate to form porous silicon of the sinkers and the layer; (e) oxidizing the porous silicon to form silicon dioxide; and (f) etching the silicon dioxide to form the cavity and the diaphragm.

It is an advantage of the invention to provide a method of forming a single crystal diaphragm pressure sensor that facilitates the placement of electronic circuitry directly on the diaphragm.

Other features of and advantages of the invention will become apparent to those skilled in the art upon review of the following detailed description, claims, and drawings.

BRIEF DESCRIPTION OF THE DRAWINGS

FIG. 1 is a illustration showing a pressure sensor of the invention.

FIG. 2 is a cross-sectional view of a pressure sensor embodying various of the features of the invention.

FIG. 3 is a cross-sectional view similar to FIG. 2 and showing a p-type layer implanted in the substrate.

FIG. 5 is a view similar to FIG. 3 and showing an n-type epitaxial layer and p-type sinkers.

FIG. 7 is a view similar to FIG. 5 and showing a precavity region.

Figure 4:
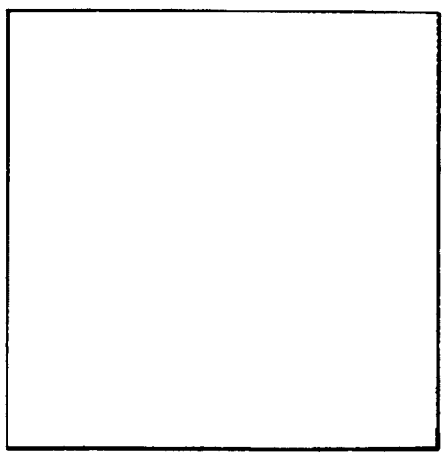
FIG. 4 is a p-type layer mask for patterning the p-type layer shown in FIG. 3.

Before one embodiment of the invention is explained in detail, it is to be understood that the invention is not limited in its application to the details of the construction and the arrangements of components set forth in the following description or illustrated in the drawings. The invention is capable of other embodiments and of being practiced or being carried out in various ways. Also, it is to be understood that the phraseology and terminology used herein is for the purpose of description and should not be regarded as limiting.

DETAILED DESCRIPTION OF A PREFERRED EMBODIMENT

Illustrated in FIG. 1 is an apparatus 4 formed on a silicon wafer or substrate 8 and embodying various of the features of the invention. Although different apparatus such as pressure sensors, strain sensors and displacement sensors may be formed according to the invention, in the illustrated embodiment the apparatus 4 is a pressure sensor. The pressure sensor 4 includes a force transducer 10 formed on the silicon substrate 8. The force transducer 10 includes a diaphragm 11, further described below, which is exposed to the pressure being sensed. The force transducer 10 also includes means 12 for sensing strain in the diaphragm 11, as further described below. The pressure sensor 4 further includes integrated circuitry 13 formed on the substrate 8 and connected to the force transducer 10 to provide power for the force transducer 10 and to convert output from the force transducer 10 to a desired format. It will be appreciated by those skilled in the art that the integrated circuitry 13 can be suitably arranged in various configurations. The configurations of the integrated circuitry 13 are known and will not be described in further detail.

The wafer or substrate 8 (FIG. 2) is a single crystal of silicon which is altered as described below. The wafer 8 includes spaced upper and lower side portions 16 (lower side portion not shown). The upper side portion 16 includes a horizontal upper surface 17. Although the wafer 8 can be of any suitable thickness, in the illustrated embodiment the wafer 8 is about 500 microns thick. An epitaxial layer 18 is deposited on the upper surface 17, as further described below.

A cavity 22 (FIG. 2) is defined in the upper side portion 16. For purposes of describing the cavity 22, the upper side portion 16 of the wafer 8 is taken to include the epitaxial layer (i.e., as shown in the drawings, portions of the cavity 22 are defined by the epitaxial layer 18 deposited on the upper surface 17). The cavity 22 includes side walls 28 and a horizontal bottom wall 36.

The plate or diaphragm 11 is supported in the cavity 22. The diaphragm 11 includes an upper side and a lower side which is spaced from the upper side. The diaphragm 11 also includes opposite edge portions 37 (shown in detail only in FIG. 1) which are connected to and integral with the side walls 28. The diaphragm 11 being thus supported can be described as an "edge-supported" diaphragm however, the process described herein is equally applicable to diaphragm structures that are not evacuated such as, for example, tethered plates, etc. Pressure applied to the upper side deflects and causes strain in the diaphragm 11. In the specific embodiment illustrated, the diaphragm 11 is formed in the epitaxial layer 18. In other embodiments (not shown), the diaphragm 11 can be formed partially in the epitaxial layer and in the upper side portion 16 of the wafer 8. Although the diaphragm 11 can be of any suitable size, i.e., in a range of about 10 microns to about 150 microns depending upon the application, in the illustrated embodiment each edge of the diaphragm 11 is about 80 microns in length. Although the diaphragm 11 can be of any suitable thickness, in the illustrated embodiment the diaphragm 11 has a thickness of about 2 microns. The diaphragm 11 cooperates with the side walls 28 and bottom wall 36 to enclose the cavity 22.

In the illustrated embodiment, the means 12 for measuring strain on the diaphragm 11 is a set of four piezoresistors 38. The piezoresistors 38 are mounted partially on the diaphragm 11 and extend off of the edge portions 37 of the diaphragm 11, as further described below, and are connected to generate an output signal which is proportional to pressure exerted on the diaphragm 11. The piezoresistors 38 are connected to the integrated circuitry 13 in a known manner. It will be appreciated by those skilled in the art that in different embodiments (not shown), other specific means 12, such as a capacitor, can be used for measuring strain in the diaphragm.

The force transducer 10 includes electrical contacts 40 connected to the piezoresistors 38 and to the integrated circuitry 12. In the illustrated embodiment, the electrical contacts 40 comprise conductive material, such as aluminum, which is deposited as further described below. In other embodiments (not shown), the electrical contacts may be formed by conductive regions defined by implanted dopants.

The transducer 10 can be formed on any suitable silicon wafer or substrate 8. A suitable substrate 8 is a p-type silicon wafer of lightly doped P(100) silicon having p-type boron dopant with a carrier concentration between $1 \times 10^{15}$ cm$^{-3}$ and $1 \times 10^{16}$ cm$^{-3}$, a <100> cut lattice, 6.0–18.0 ohm-cm resistance. Wafers meeting SEMI standard prime CZ or float zone, for example, are suitable. Examples of other suitable silicon wafers are those having lower concentrations of p-type or n-type dopants than layers to be subsequently added to the wafer, such that the dopant acts as an etch stop at the boundary with the added layers.

Figure 10:
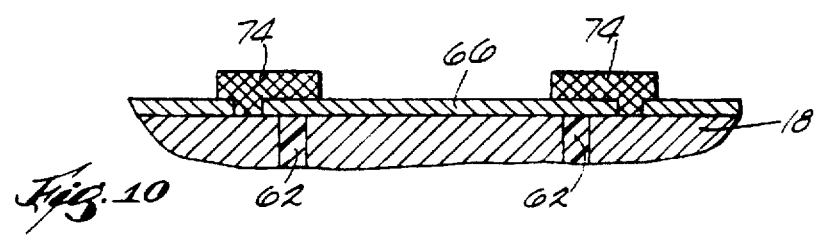
FIG. 10 is a view similar to FIG. 8 and showing cover layers.
Figure 13:
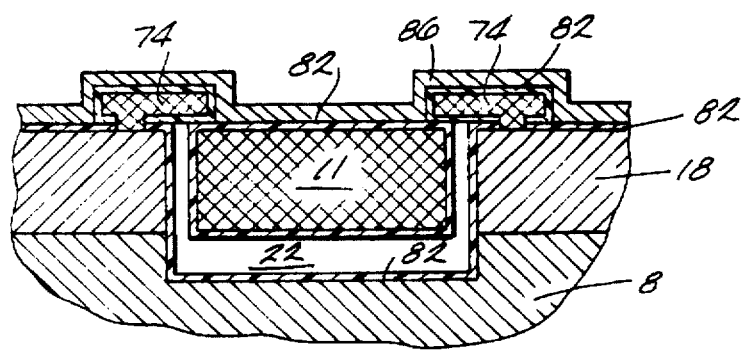
FIG. 13 is a view similar to FIG. 12 and showing the sealed etch channels.
Figure 14:
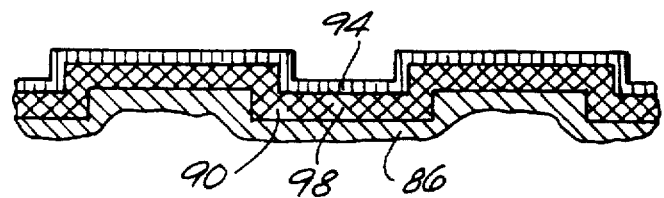
FIG. 14 is a view similar to FIG. 13 and showing a polysilicon layer and an upper p-type layer implanted in the polysilicon layer.
Figure 15:
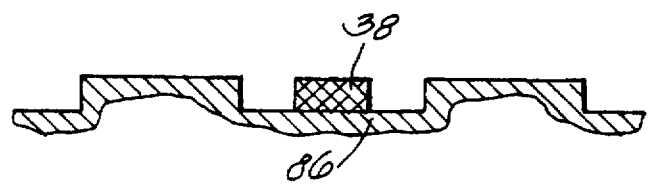
FIG. 15 is a view similar to FIG. 14 and showing a piezoresistor.
Figure 17:
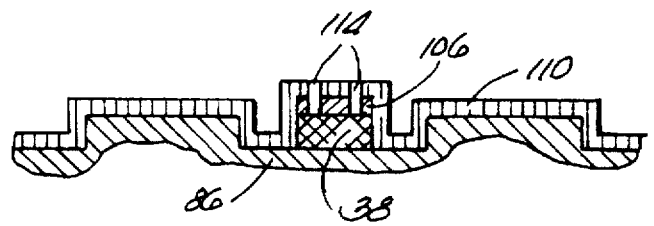
FIG. 17 is a view similar to FIG. 15 and showing insulating layers and electrical contact cavities.

The force transducer 10 having the specific construction described herein is formed by altering the p-type wafer 8 according to the following steps:

1. implant a p-type layer 50 (FIG. 3) in the p-type wafer 8;

2. deposit the epitaxial n-type layer 18 (FIG. 5) on the upper surface 17 of the wafer 8;

3. implant p-type sinkers 58 (FIG. 5) through the epitaxial n-type layer 18 and into connection with the p-type layer 50;

4. form porous silicon of the p-type layer 50 and the p-type sinkers 58 by anodization to form a pre-cavity region 62 (FIG. 7);

5. oxidize the porous silicon to form silicon dioxide in the pre-cavity region 62 and to form a screening layer 66 of silicon dioxide over the epitaxial n-type layer 18;

6. form anchor cavities 70 (FIG. 8) in the silicon dioxide screening layer 66 by etching;

7. deposit polysilicon and etch the polysilicon to form cover layers 74 (FIG. 10);

8. dissolve the silicon dioxide in the screening layer 66 and pre-cavity region 62 by etching to form (FIG. 12) open etch channels 78 and the cavity 22;

9. seal and evacuate the cavity 22 by forming (FIG. 13) a silicon dioxide layer 82 and thereafter depositing a secondary sealing material 86 to close the etch channels 78;

10. deposit an upper polysilicon layer 90 (FIG. 14);

11. form an upper screening layer 94 (FIG. 14) of silicon dioxide on the upper polysilicon layer 90;

12. implant an upper p-type layer 98 (FIG. 14) in the polysilicon layer 90;

13. etch the polysilicon layer 90 to form the piezoresistors 38 (one shown in FIG. 15);

14. form screening layers 106 (FIG. 17) over the piezoresistors 38;

15. deposit an insulating layer 110 (FIG. 17);

16. etch electrical contact cavities 114 (two shown in FIG. 17) through the insulating layer 110 and the screening layer 106 and into contact with the piezoresistors 38; and 17. deposit a metal layer and etch the metal layer to form electrical contacts 40 (two shown in FIG. 19) for connection to the integrated circuitry 13.

It will be appreciated by those skilled in the art that various of the above-mentioned steps may be omitted or altered in different specific embodiments of the invention. For example, the piezoresistors 38 may be omitted or replaced if different means are employed for sensing strain in the diaphragm.

In the illustrated embodiment, the wafer 8 is prepared for implantation of the buried p-type layer 50 by initially forming a screening layer of $SiO_2$ on the upper surface 17 of the wafer 8. In the illustrated embodiment, the screening layer of $SiO_2$ has a thickness of about 5000+/−500 angstroms. The $SiO_2$ can be formed by any suitable means. In the illustrated embodiment, oxidation to form the $SiO_2$ screening layer is carried out by first "pushing" with about 2.25 liters per minute (l/m) of $N_2$ at a temperature of about 550° C. for a period of about 4 hours, ramping about 2.25 l/m of $O_2$ gas at a rate of about 20° C./minute, oxidizing with about 2.25 l/m of $H_2$ and $O_2$ at about 1000° C. for a period of about 120 minutes, and then ramping with about 8 l/m of $N_2$ at a rate of about 20° C./minute. The term "pushing" as used herein means inserting the wafer into the furnace. As also used herein, the term "ramping" means changing the temperature in the furnace. The $SiO_2$ screening layer thereafter is etched to achieve a substantially uniform thickness. Etching with a 10:1 buffered oxide etching solution for a period of about 5 minutes is suitable. A suitable etching solution includes about 40% ammonia fluoride, 15% hydrogen fluoride and 45% water. Those skilled in the art will recognize that forming and etching a screening layer of $SiO_2$ before each implant or deposition step may assist in control of the subsequent implantation or deposition step. In other embodiments, any of the screening layers of $SiO_2$ may be omitted.

The p-type layer 50 (FIG. 3) is implanted in the substrate 8 by any suitable means. In the illustrated embodiment, the p-type layer 50 is patterned by applying photoresist and exposing the photoresist with the mask shown in FIG. 4. In the illustrated embodiment, the p-type dopant is boron. The boron is dosed at a concentration of $5 \times 10^{13}$ $cm^{-2}$ at energy levels of 50, 100 and 150 KeV. After the p-type layer 50 is implanted and the photoresist is removed, the p-type layer 50 is driven by thermal annealing to a final thickness of about 1 micron. Thermal annealing can be carried out by pushing with 2.25 l/m of $O_2$ at 850° C. for a period of about 30 minutes, ramping 2.25 l/m of $O_2$ at a rate of 20° C./minute, annealing with 2.25 l/m of $N_2$ at about 1000° C. for a period of about 10.5 hours, and ramping with 8 l/m of $N_2$ at a rate of 20° C./min.

The n-type epitaxial layer 18 (FIG. 5) is deposited on the entire upper surface 17 of the wafer 8 by epitaxial deposition. In the illustrated embodiment, the wafer 8 is prepared for receiving the n-type epitaxial layer 18 by etching with a 10:1 buffered oxide etching solution to remove the $SiO_2$ formed in the previous thermal annealing step. The n-type epitaxial layer 18 is deposited in a conventional manner. In the illustrated embodiment, the n-type epitaxial layer 18 has a thickness of about 2+/−0.2 microns and a resistivity of about 0.35+/−0.05 ohms-cm.

Figure 6:
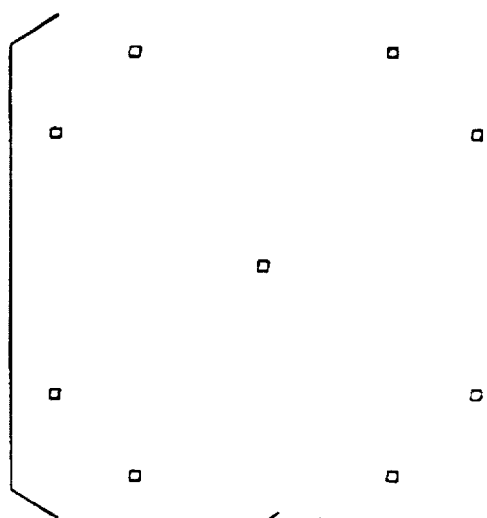
FIG. 6 is a p-type sinker mask for patterning the p-type sinkers shown in FIG. 5.

The p-type sinkers 58 (FIG. 5) are implanted in the n-type epitaxial layer 18 and into electrical connection with the p-type layer 50. In the illustrated embodiment, the n-type epitaxial layer 18 is prepared for receiving the p-type sinkers 58 by partially oxidizing the n-type epitaxial layer 18 to form a screening layer of $SiO_2$ having a thickness of about 500+/−50 angstroms. The $SiO_2$ can be formed by first "pushing" with about 2.25 liters per minute (l/m) of $H_2$ and $O_2$ at a temperature of about 850° C. for a period of about 10 minutes, and then oxidizing with about 2.25 l/m of $H_2$ and $O_2$ at about 850° C. for a period of about 30 minutes. The p-type sinkers 58 are patterned by applying photoresist and exposing the photoresist with the mask shown in FIG. 6. In the illustrated embodiment, the p-type dopant is boron dosed at a concentration of $5 \times 10^{13}$ $cm^{-2}$ at an energy level of 120 KeV. After the p-type sinkers 58 are implanted, the photoresist is removed.

The p-type layer 50 and the p-type sinkers 58 are anodized to form a pre-cavity region 62 (FIG. 7) consisting of porous silicon. Those skilled in the art will appreciate that anodization of the p-type layer 50 and the p-type sinkers 58 is an electrochemical process which can be carried out in any suitable manner. In the illustrated embodiment, anodization is carried out in an electrochemical cell containing from 10 to 50 weight percent hydrofluoric acid. The electrochemical cell is separated into two chambers by the wafer 8 being anodized. Two platinum plates serve as the anodic and cathodic electrodes. The back or lower side portion of the wafer 8 faces the anodic electrode and the upper side portion 16 faces the cathodic electrode. An anodization voltage between about 1 and 7 volts is applied across the electrodes. The anodization process automatically stops when the low resistance p-type layer 50 and p-type sinkers 58 are converted into porous silicon in the pre-cavity region 62 (i.e., the area previously occupied by the p-type layer 50 and p-type sinkers 58).

The porous silicon in the pre-cavity region 62 is oxidized to form silicon dioxide. The porous silicon can be oxidized in any suitable manner. In the illustrated embodiment, the porous silicon is oxidized by first "pushing" with about 2.25 liters per minute (l/m) of $O_2$ at a temperature of about 300° C. for a period of about 1 hour to stabilize the porous silicon, ramping with 2.25 l/m of $O_2$ at 20° C./min, and oxidizing with 2.25 l/m of $H_2$ and $O_2$ at 850° C. for about 30 minutes to 1 hour. In the illustrated embodiment, the maximum oxidation temperature is maintained at 850° C. in order to avoid inelastic change in the resulting oxide. Upon oxidation, the porous silicon in the pre-cavity region 62 is converted to silicon dioxide, and a screening layer 66 (FIG. 8) of silicon dioxide having a thickness of about 1500 angstroms is incidentally formed over the upper surface of the n-type epitaxial layer 50.

Figure 8:
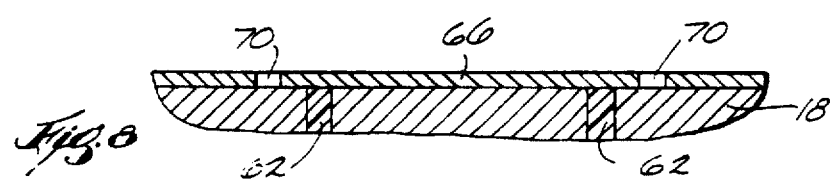
FIG. 8 is a view similar to FIG. 7 and showing a screening layer and anchor cavities.
Figure 9:
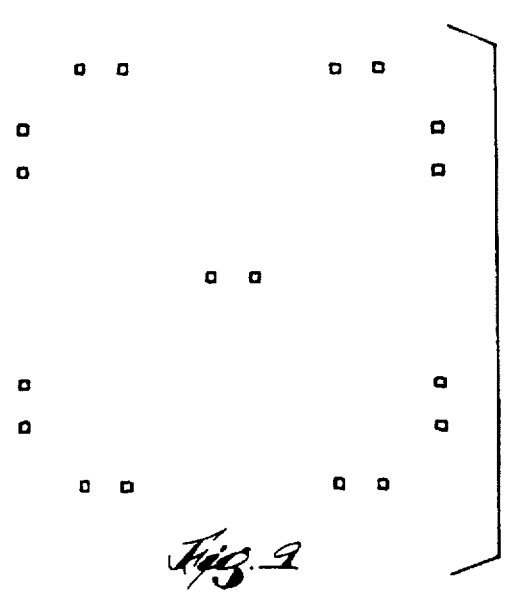
FIG. 9 is an anchor mask for patterning the anchor cavities shown in FIG. 8.

The wafer 8 is prepared for receiving the cover layers 74 by forming anchor cavities 70 (FIG. 8). In the illustrated embodiment, the anchor cavities 70 are formed in the screening layer 66 of $SiO_2$. The anchor cavities 70 are patterned by applying photoresist and exposing the photoresist using the anchor mask shown in FIG. 9. The wafer is etched to form the anchor cavities 70 (FIG. 8) in the screening layer 66. Etching with a 10:1 buffered oxide etching solution for a period of about 1.5 minutes is suitable to form the anchor cavities 229. The photoresist thereafter is removed.

Figure 11:
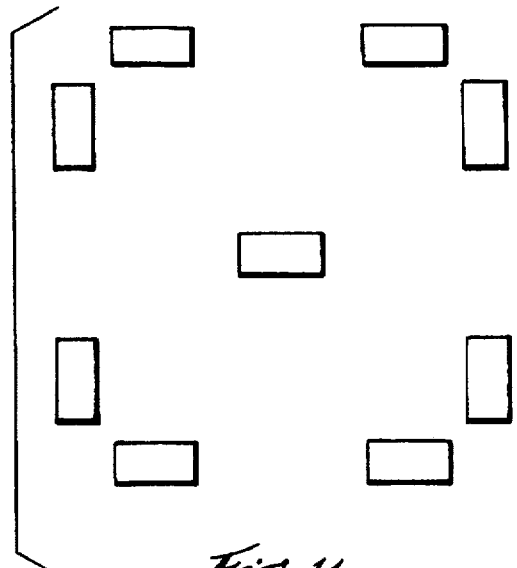
FIG. 11 is a cover mask for patterning the cover layers shown in FIG. 10.

A layer of cover material is deposited over the entire upper side portion of the wafer and then etched to define the cover layers 74 (two shown in FIG. 10). Any suitable cover material can be used. In the illustrated embodiment, the cover material is polysilicon deposited on the wafer by low pressure chemical vapor deposition (LPCVD). The polysilicon is suitably deposited at a temperature of about 580° C. to about 650° C. to a thickness of about 1 micron. The polysilicon thus deposited is firmly secured to the wafer by polysilicon which fills the anchor cavities 70 and thus defines integral polysilicon anchors. The cover layers 74 (FIG. 10) are patterned by applying photoresist and exposing the photoresist using the cover mask shown in FIG. 11. The polysilicon is etched to form the cover layers 74. Any suitable polysilicon etching technique can be used. For example, plasma etching with $SF_6$ is suitable. The photoresist thereafter is removed.

Figure 12:
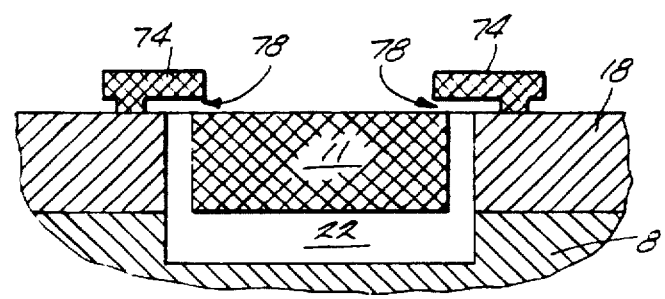
FIG. 12 is a view similar to FIG. 10 and showing a cavity and open etch channels.

The porous silicon dioxide in the precavity region 62 is removed or dissolved by etching to form the cavity 22 (FIG. 12). Any suitable etchant may be employed. In the illustrated embodiment, the etchant is hydrofluoric acid vapor. The use of hydrofluoric acid vapor to etch the cavity 22 avoids having to later dry the cavity. In other embodiments, such as when a liquid etchant is used, it may be necessary to rinse the cavity with water and to dry the cavity by a technique such as sublimation of cyclohexane, as is known in the art. The hydrofluoric acid vapor etches away the $SiO_2$ between the anchors 70, thus forming open etch channels 78 in the layer underneath the cover layers 74, and thereafter etches away the silicon dioxide in the precavity region 62. The cavity 22 and etch channels 78 (FIG. 12) thus formed are open, in the sense that the etch channels 78 are opened in the spaces between the anchors 70 and underneath the cover layers 74.

The cavity 22 is sealed and evacuated in a suitable manner. It is preferred to evacuate the cavity in order to provide a vacuum for absolute pressure sensing. In the illustrated embodiment, the wafer is oxidized to form residual $SiO_2$ layers 82 (FIG. 13) on the inner surfaces defining the cavity 22 and the etch channels 78. The residual $SiO_2$ layers 82 can be formed by oxidation by pushing 2.25 l/m of $H_2$ and $O_2$ at 850° C. for 10 minutes and oxidizing with 2.25 l/m of $H_2$ and $O_2$ at 850° C. for 30 minutes. The $SiO_2$ layers 82 formed on the inner surfaces of the etch channels 78 substantially closes the etch channels 78. The $SiO_2$ layers 82 are further sealed by depositing a secondary sealing layer 86 (FIG. 13) of a secondary sealing material. In the illustrated embodiment, the secondary sealing material is silicon nitride. In other embodiments, the secondary sealing material can be another suitable material, such as polysilicon. The silicon nitride can be deposited in any suitable manner. In the illustrated embodiment, the silicon nitride is deposited at a temperature of 835° C. to a final thickness of about 1200+/−120 angstroms. Upon sealing the etch channels 78, $O_2$ remaining in the cavity 22 continues to react until substantially all $O_2$ in the cavity 22 is consumed. The cavity 22 thus is sealed and evacuated.

The upper polysilicon layer 90 (FIG. 14) is deposited over the entire upper surface in a suitable manner. In the illustrated embodiment, the polysilicon is deposited by low pressure chemical vapor deposition (LPCVD). The polysilicon is suitably deposited at a temperature of about 580° C. to about 650° C. to a thickness of about 0.45 microns.

In the illustrated embodiment, the upper polysilicon layer 90 is prepared for receiving the upper p-type layer 98 implant by forming a screening layer 94 (FIG. 14) of silicon dioxide on the upper polysilicon layer 90. A suitable silicon dioxide screening layer 94 having a thickness of about 250+/−25 angstroms can be formed by oxidation by pushing 2.25 l/m of $O_2$ at 850° C. for 10 minutes and oxidizing with 2.25 l/m of $O_2$ at 850° C. for 30 minutes.

The upper p-type layer 98 (FIG. 14) is implanted in the upper polysilicon layer 90 in a suitable manner. In the illustrated embodiment, the upper p-type layer 98 is implanted by uniform bombardment of the upper screening layer 94. In the illustrated embodiment, the p-type dopant is boron implanted at a concentration of $5 \times 10^{15}$ $cm^{-2}$ at an energy level of about 80 KeV. The upper p-type layer 98 is driven by thermal annealing to a final thickness of about 0.45 microns. Thermal annealing can be carried out by pushing with 2.25 l/m of $N_2$ at 850° C. for a period of about 10 minutes, and oxidizing with 2.25 l/m of $N_2$ at about 850° C. for a period of about 30 minutes. After the upper p-type layer 98 is implanted and annealed, the upper screening layer 94 is removed by etching. Etching in a 50:1 HF solution for about 5 minutes is suitable to remove the upper screening layer 94.

Figure 16:
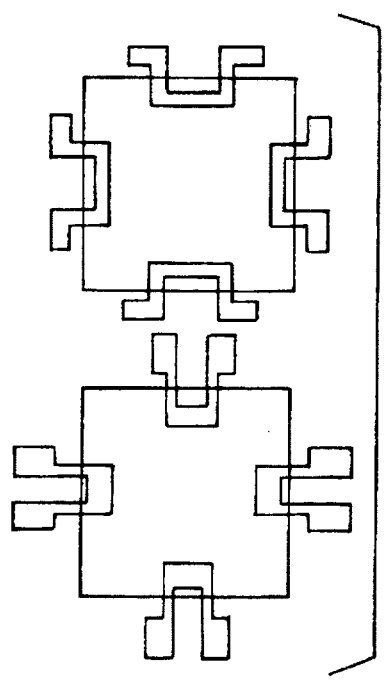
FIG. 16 is a piezoresistor mask for patterning the piezoresistors.

The piezoresistors 38 (one shown in FIG. 15) are patterned by applying photoresist and exposing the photoresist using the piezoresistor mask shown in FIG. 16. The upper polysilicon layer 90 is etched to form the piezoresistors 38. Any suitable polysilicon etching technique can be used. For example, low temperature plasma etching with $SF_6$ or $NF_3$ is suitable. The photoresist thereafter is removed.

The silicon dioxide screening layers 106 (FIG. 17) are formed over the piezoresistors 38 in a suitable manner. In the illustrated embodiment, suitable silicon dioxide screening layers 106 having a thickness of about 250+/−25 angstroms can be formed by oxidation by pushing 2.25 l/m of $O_2$ at 850° C. for 10 minutes and oxidizing with 2.25 l/m of $O_2$ at 850° C. for 30 minutes. In this manner, the silicon dioxide screening layers 106 form only over the piezoresistors 38 and not over the silicon nitride secondary screening layer 82.

The insulating layer 110 (FIG. 17) is deposited in a suitable manner. The insulating layer 110 (FIG. 17) is deposited over the screening layer 106 and over the silicon nitride secondary sealing layer 82 in a suitable manner. Any suitable insulating material can be used. In the illustrated embodiment, the insulating material is silicon nitride. In the illustrated embodiment, the silicon nitride is deposited by low pressure chemical vapor deposition (LPCVD) at 835° C. to a thickness of about 950+/−90 angstroms. The insulating layer 110 insulates the force transducer 10 from undesired electrical contact.

Figure 18:
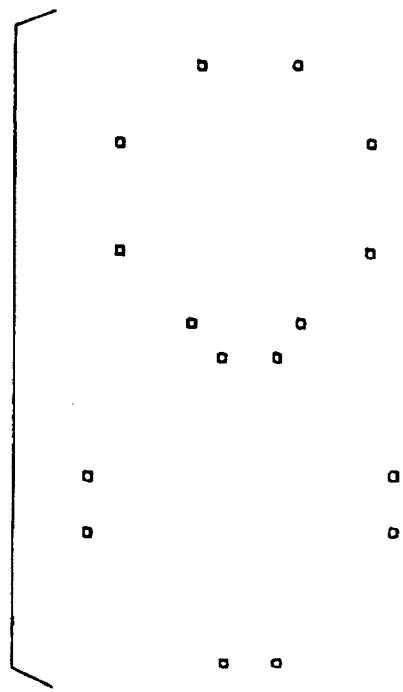
FIG. 18 is an electrical contact mask for patterning the electrical contact cavities shown in FIG. 17.
Figure 19:
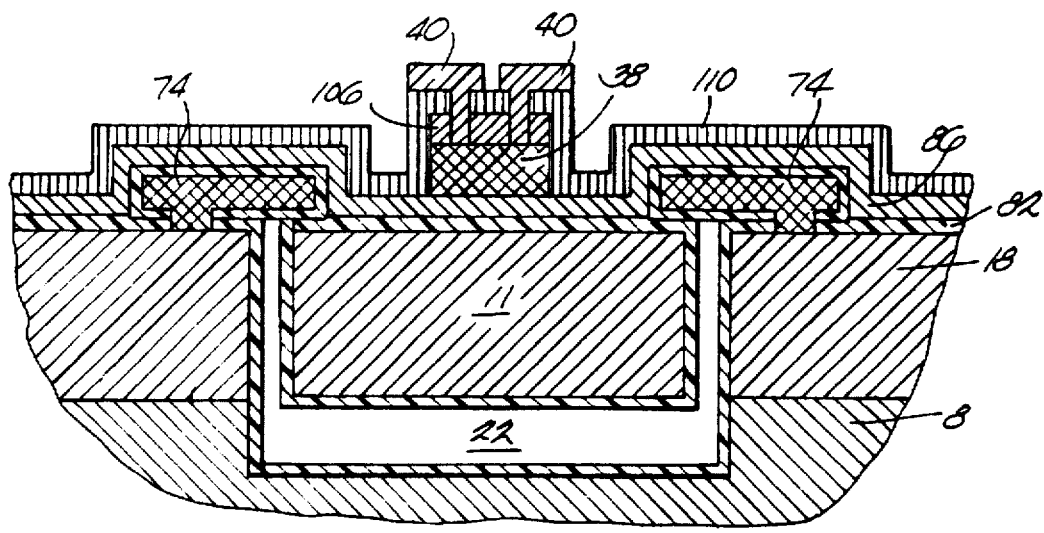
FIG. 19 is a view similar to FIG. 18 and showing metal electrical contacts.
Figure 20:
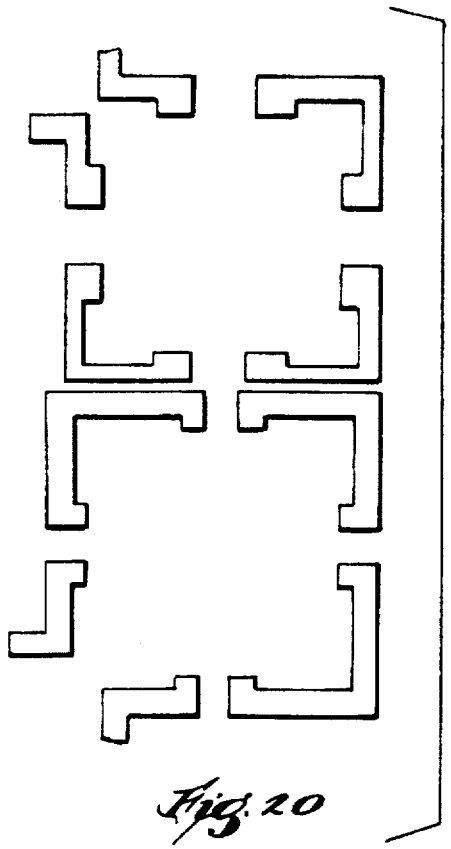
FIG. 20 is a metal mask for patterning the metal electrical contacts shown in FIG. 19.

The electrical contacts 40 are deposited in a suitable manner for connection to the integrated circuitry 13 (FIG. 19). In the illustrated embodiment, electrical contact cavities 114 (FIG. 17) are etched for receiving the metal electrical contacts 40 (FIG. 19). The electrical contact cavities 114 are patterned by applying photoresist and exposing the photoresist using the electrical contact cavity mask shown in FIG. 18. The insulating layer 110 and screening layer 106 are etched with a 50:1 buffered oxide etching solution for a period of about 2.5 minutes to form the electrical contact cavities 114 (FIG. 17). The photoresist thereafter is removed. The electrical contacts 40 (FIG. 19) are then deposited in the electrical contact cavities 114. In the illustrated embodiment, the electrical contacts 40 consist of aluminum. The aluminum is deposited to a uniform thickness of about 7500 angstroms and etched using the mask shown in FIG. 20. Thereafter, the aluminum electrical contacts 40 are alloyed into contact with the polysilicon piezoresistor 38 by alloying at 450° C. with 15% $H_2$ and 85% $N_2$.

In operation of the pressure sensor 4, pressure exerted on the diaphragm 11 produces strain, which changes the resistance of the piezoresistors 38. The changing resistance of the piezoresistors 38 causes changes in the output signal of the integrated circuitry 13. The output signal from the integrated circuitry 12 thus changes in relation to pressure exerted on the diaphragm 11.

The pressure sensor can be inexpensively formed by single-sided fabrication using the relatively few steps described above. The diaphragm is integral with the wafer and therefore provides a force transducer of high sensitivity and accuracy.

The pressure sensor 4 also includes integrated circuitry 13 formed on the substrate 8 and connected to the force transducer 10. The integrated circuitry 13 provides power for causing resonation of the beam 208 and converts output from the force transducer 10 to a desired format.

Various feature and advantages of the invention are set forth in the following claims.

What is claimed is:

1. A method of forming apparatus including a force transducer on a silicon substrate having an upper surface, the silicon substrate including a p-type dopant, the force transducer including a cavity having spaced side walls and a diaphragm supported in the cavity, the diaphragm extending between the side walls of the cavity, said method comprising the steps of:

a. implant a p-type layer in the p-type substrate;
b. deposit an epitaxial n-type layer on the upper surface of the substrate;
c. implant spaced p-type sinkers through the epitaxial n-type layer and into connection with the p-type layer;
d. form porous silicon of the p-type layer and the p-type sinkers by anodization;
e. oxidize the porous silicon to form silicon dioxide;
f. deposit a polysilicon cover layer over the sinkers; and then
g. etch the silicon dioxide to form open etch channels, the cavity and the diaphragm;
h. sealing the cavity by forming $SiO_2$ layers within the etch channels to substantially close the etch channels;
i. depositing a second polysilicon layer on the diaphragm;
j. implanting a p-type dopant in the second polysilicon layer; and
k. etching the second polysilicon layer to form a piezoresistor.

2. A method as set forth in claim 1, and further including after step (k) the step of:

l. depositing an insulating layer over the piezoresistor.

3. A method as set forth in claim 2, and further including after step (l) the step of:

m. forming electrical contacts for connection with the piezoresistor by etching through the insulating layer.

4. A method of forming a force transducer on a silicon substrate having an upper surfacer the silicon substrate including a n-type dopant, the force transducer including a cavity having spaced side walls and a diaphragm supported in the cavity, the diaphragm extending between the side walls of the cavity, said method comprising the steps of:

a. implant a n-type layer in the n-type substrate;
b. deposit an epitaxial p-type layer on the upper surface of the substrate;
c. implant spaced n-type sinkers through the epitaxial p-type layer and into connection with the n-type layer;
d. form porous silicon of the n-type layer and the n-type sinkers by anodization;
e. oxidize the porous silicon to form silicon dioxide;
f. deposit a polysilicon cover layer over the sinkers; and then
g. etch the silicon dioxide to form open etch channels, the cavity and the diaphragm;
h. sealing the cavity by forming $SiO_2$ layers within the etch channels to substantially close the etch channels;
i. depositing an second polysilicon layer on the diaphram;
j. implanting a dopant in the second polysilicon layer; and
k. etching the second polysilicon layer to form piezoresistors.

5. A method as set forth in claim 4, and further including after step (k) the step of:

l. depositing an insulating layer over the piezoresistor.

6. A method as set forth in claim 5, and further including after step (l) the step of:

m. forming electrical contacts for connection with the piezoresistor by etching through the insulating layer.

* * * * *

UNITED STATES PATENT AND TRADEMARK OFFICE
CERTIFICATE OF CORRECTION

PATENT NO. : 5,736,430
DATED : April 7, 1998
INVENTOR(S) : James D. Seefeldt and Michael F. Mattes It is certified that error appears in the above-indentified patent and that said Letters Patent is hereby corrected as shown below:

Column 9, line 34, "surfacer" should be --surface--.

Signed and Sealed this

Twenty-ninth Day of September, 1998

Attest:

BRUCE LEHMAN

Attesting Officer

Commissioner of Patents and Trademarks